United States Patent
Yoon et al.

(10) Patent No.: US 11,112,823 B2
(45) Date of Patent: Sep. 7, 2021

(54) DISPLAY PANEL AND DISPLAY DEVICE HAVING THE SAME

(71) Applicant: SAMSUNG ELECTRONICS CO., LTD., Suwon-si (KR)

(72) Inventors: Seung Il Yoon, Suwon-si (KR); Ho June Yoo, Suwon-si (KR); Eun Seok Choi, Suwon-si (KR); Hyun Kyu Yun, Suwon-si (KR); Kang Wook Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/742,157

(22) Filed: Jan. 14, 2020

(65) Prior Publication Data
US 2020/0241592 A1     Jul. 30, 2020

(30) Foreign Application Priority Data
Jan. 29, 2019   (KR) ........................ 10-2019-0011062

(51) Int. Cl.
| | |
|---|---|
| *G06F 1/16* | (2006.01) |
| *H01L 33/24* | (2010.01) |
| *H01L 25/075* | (2006.01) |
| *G06F 3/16* | (2006.01) |

(52) U.S. Cl.
CPC ............ *G06F 1/1605* (2013.01); *G06F 3/167* (2013.01); *H01L 25/0753* (2013.01); *H01L 33/24* (2013.01)

(58) Field of Classification Search
CPC ... G06F 1/1605; G06F 3/167; H01L 25/0753; H01L 33/24
See application file for complete search history.

(56) References Cited

U.S. PATENT DOCUMENTS

| | | | |
|---|---|---|---|
| 8,947,627 B2* | 2/2015 | Rappoport | G06F 1/1698 349/151 |
| 2011/0193933 A1 | 8/2011 | Ryu et al. | |
| 2014/0112518 A1* | 4/2014 | Lee | H04R 1/04 381/365 |
| 2015/0189228 A1 | 7/2015 | Lee et al. | |
| 2016/0239260 A1* | 8/2016 | Yum | H04N 21/485 |
| 2018/0069060 A1* | 3/2018 | Rappoport | H01L 51/0097 |
| 2019/0027534 A1* | 1/2019 | Rotzoll | H01L 25/0753 |

FOREIGN PATENT DOCUMENTS

KR    10-2015-0005089      1/2015

OTHER PUBLICATIONS

International Search Report dated May 27, 2020 in International Patent Application No. PCT/KR2020/001117.

\* cited by examiner

*Primary Examiner* — Rockshana D Chowdhury
(74) *Attorney, Agent, or Firm* — Staas & Halsey LLP

(57) ABSTRACT

Provided is a display device or a display panel including a substrate on which a plurality of light emitting elements are mountable, and on which at least one hole is formed to penetrate through the substrate among the plurality of light emitting elements, and at least one microphone mountable on a rear side of the substrate to collect a sound passing through the at least one hole.

16 Claims, 14 Drawing Sheets

DISPLAY PANEL AND DISPLAY DEVICE HAVING THE SAME

CROSS-REFERENCE TO RELATED APPLICATION

This application is based on and claims priority under 35U. S. C. § 119 to Korean Patent Application No. 10-2019-0011062 filed on Jan. 29, 2019, the disclosure of which is incorporated herein by reference in its entirety.

BACKGROUND

1. Field

The disclosure relates to a display device including a microphone and a method of controlling the same.

2. Description of Related Art

Display devices are a kind of output device for visually presenting data information such as characters, figures, etc., and still or video images. The display device occasionally includes a camera or a microphone to provide various multimedia environments.

A demand for display devices having a large screen and a slim and bezel-less design is ever increasing. Furthermore, with advanced communication technologies, multimedia capabilities of the display device have become important, and user demand is growing to convey clear and vivid sound.

For conventional display devices, a sound receiving hole for a microphone is machined in a bezel on an outer edge of the display panel and then the microphone is arranged inside the sound receiving hole, or a separate module including the microphone is attached to the display device. However, on recent occasions where the width of the bezel is very narrow or there is no bezel, it is not easy to arrange the microphone in the display device. In addition, on an occasion of installing the microphone in the bezel of a display device that is growing larger in size these days or attaching the separate microphone module onto an outer edge of the display device, sound collecting performance may be degraded because there is a difference between the height or location at which the user gives utterance and the height or location of the microphone.

SUMMARY

In accordance with an aspect of the disclosure, a display panel includes a substrate having a plurality of light emitting elements mounted on the substrate, at least one hole formed to penetrate the substrate between the plurality of light emitting elements, and at least one microphone mounted on a rear side of the substrate to collect a sound passing through the at least one hole.

The at least one microphone may include a plurality of microphones. The display panel may further include a processor configured to remove noise based on a voice collected by the plurality of microphones.

The at least one microphone may include a plurality of microphones. The display panel may further include a processor configured to determine a location of an utterer by comparing voices collected by the plurality of microphones.

The display panel may further include a guide member mounted on the rear side of the substrate to cover the at least one hole and the at least one microphone.

The guide member may include a rubber material.

The guide member may include a plurality of guide members.

The display panel may further include a processor configured to remove noise based on voices collected by the plurality of guide members.

The display panel may further include a processor configured to determine a location of an utterer by comparing voices collected by the plurality of guide members.

The at least one hole may be formed between pixels, each pixel including three of the plurality of light emitting elements.

In accordance with another aspect of the disclosure, a display device includes a display panel; at least one hole formed to penetrate an image display area of the display panel; at least one microphone installed on a rear side of the display panel; and a guide member arranged on the rear side of the display panel to collect a sound passing through the at least one hole by the microphone.

The at least one microphone may be installed on the rear side of the display panel.

The at least one microphone may be installed on the guide member.

The display device may further include a case supporting the display panel. The microphone may be installed on the case.

The guide member may include a plurality of guide members.

The display panel may include a substrate and a plurality of light emitting elements mounted on the substrate. The at least one hole may be formed to penetrate the substrate between the plurality of light emitting elements.

The at least one hole may be formed between pixels, each pixel including three of the plurality of light emitting elements.

The at least one microphone may include a plurality of microphones. The display device may further include a processor configured to remove noise based on a voice collected by the plurality of microphones.

The at least one microphone may include a plurality of microphones. The display device may further include a processor configured to determine a location of an utterer by comparing voices collected by the plurality of microphones.

In accordance with another aspect of the disclosure, a display panel includes at least one hole formed between pixels; and at least one microphone configured to collect a sound passing through the at least one hole.

The display panel may further include at least one guide member guiding the sound passing through the at least one hole to be collected by the at least one microphone.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
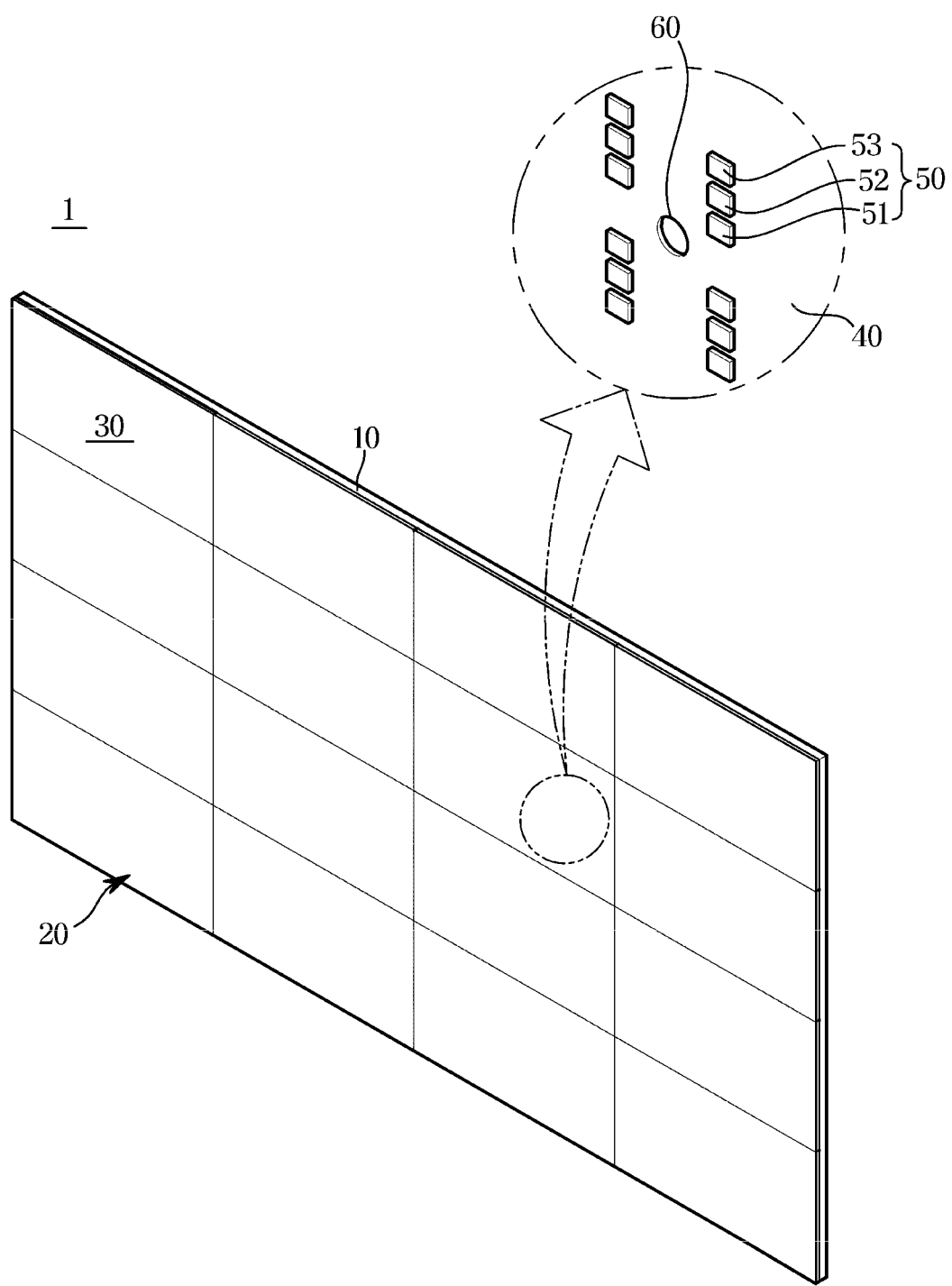
FIG. 1 is a perspective font view of a display device, according to an embodiment of the disclosure.

Embodiments and features as described and illustrated in the disclosure are merely examples, and there may be various modifications replacing the embodiments and drawings at the time of filing this application.

Throughout the drawings, like reference numerals refer to like parts or components. For the sake of clarity, the elements of the drawings are drawn with exaggerated forms and sizes.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. For example, a first element could be termed a second element without departing from the scope of the disclosure. Descriptions shall be understood as to include any and all combinations of one or more of the associated listed items when the items are described by using the conjunctive term "~ and/or ~," or the like.

Reference will now be made in detail to embodiments of the disclosure, examples of which are illustrated in the accompanying drawings, wherein like reference numerals refer to the like elements throughout.

The disclosure provides a display panel equipped with a microphone at a height or location corresponding to height or a location at which the user utters a sound.

The disclosure also provides a display device including a display panel equipped with a microphone without need for a space or structure for installation of the microphone in the display device.

Figure 2:
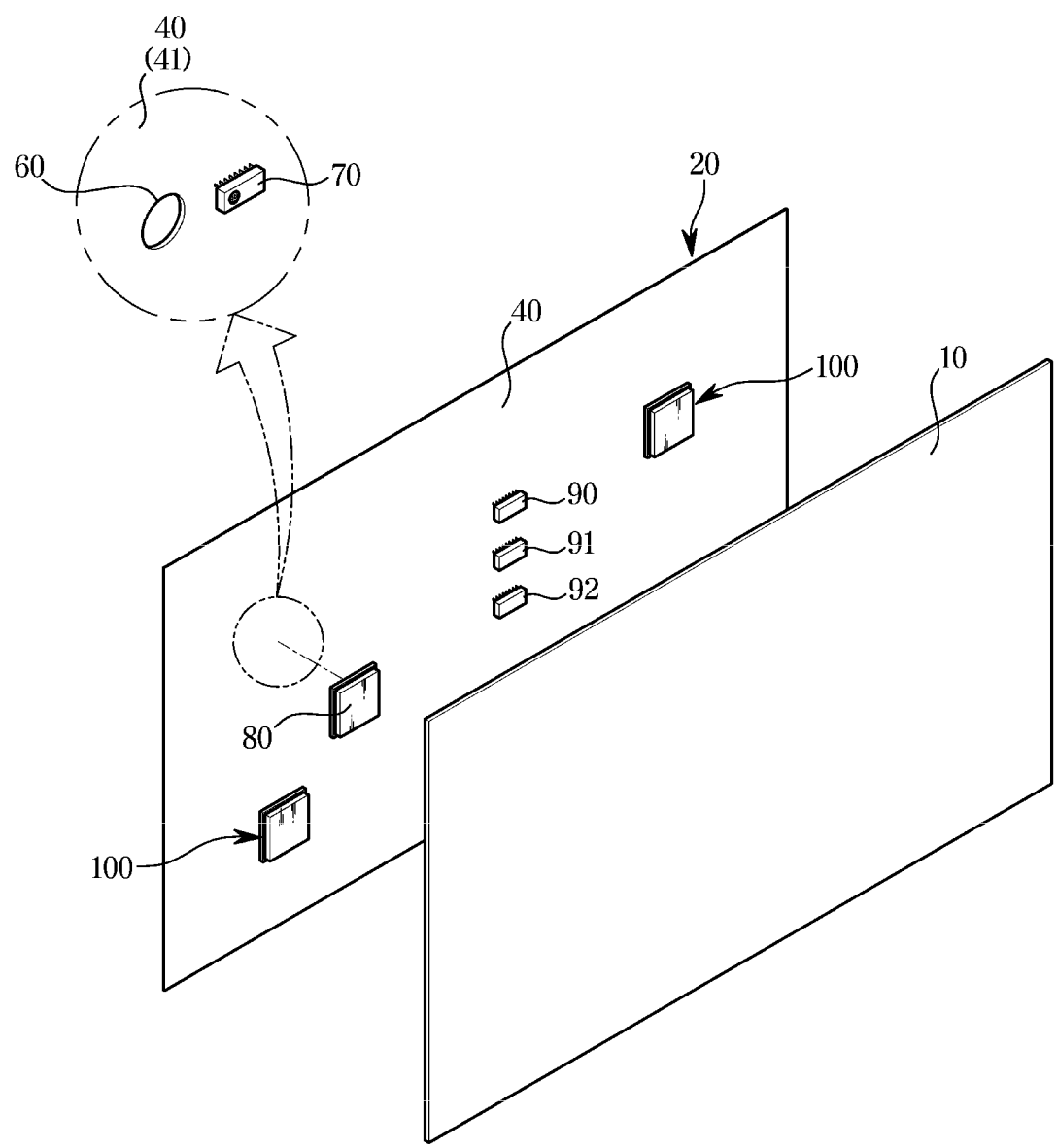
FIG. 2 is a perspective rear view of the display device of FIG. 1 with a display panel and a case separated from each other.

FIG. 1 is a perspective font view of a display device, according to an embodiment of the disclosure, and FIG. 2 is a perspective rear view of the display device of FIG. 1 with a display panel and a case separated from each other.

Referring to FIG. 1, a display device 1 may be a device for displaying information, materials, data, etc., in characters, figures, graphs, images, etc., and may be implemented as a television, a personal computer, a mobile device, a digital signage, etc.

Display devices are getting thinner and larger these days. For simple design of the display device, edges, i.e., bezels, of the display panel is getting thinner as well.

For the display device, a liquid crystal panel (LCD) or organic light emitting diode (OLED) panel formed by depositing OLEDs on a substrate may be used. Furthermore, a new panel such as a micro LED panel having inorganic light emitting elements mounted on a substrate and using the inorganic light emitting elements themselves as pixels is being studied. The micro LED panel may be designed to be compact and slim because it may not need backlight and may have a minimized bezel, and has good properties in brightness, resolution, power consumption, and durability.

Furthermore, as complex processes are not required except for a process to pick up and transfer the inorganic light emitting element onto the substrate from a wafer, the micro LED panel may be manufactured to have various resolutions and sizes, and may easily implement a large screen by putting unit modules together.

In an embodiment of the disclosure, the display device 1 may include a case 10 and a display panel 20 installed within the case 10. The case 10 may support the display panel 20. The case 10 may be installed on the floor via a stand (not shown), or on the wall via a hanger (not shown). The display device 1 may include a power supplier (not shown) for supplying power to the display panel 20, and a control board (not shown) for controlling operation of the display panel 20.

The display panel 20 may include a plurality of display modules 30. The plurality of display modules 30 may be arranged vertically and horizontally to be adjacent to one another. The plurality of display modules 30 may be arranged in the form of an M×N matrix. In the embodiment of the disclosure, there are 16 display modules 30 arranged in a 4×4 matrix, but the number and the arrangement scheme of the display modules 30 are not limited thereto.

The display panel 20 or the display module 30 may include a substrate 40, and a plurality of light emitting elements 50 mounted on the substrate 40. The substrate 40 may be formed with polyimide, FR4, glass, etc. The substrate 40 may include thin film transistors (TFTs), and on the top surface of the substrate 40, there may be first and second pad electrodes (not shown) formed to electrically coupled with the light emitting elements 50.

The plurality of light emitting elements 50 may be formed with an inorganic material, and may include inorganic light emitting elements each having a size of a few to hundreds of micrometers (μm) in each of the length and the width. The light emitting element 50 may be picked up from a silicon wafer and transferred directly onto the substrate 40. The plurality of light emitting elements 50 may be picked up and transferred in an electrostatic method using an electrostatic head or a bonding method using an elastic high molecular substance such as PDMS, silicon, or the like as a head.

The plurality of light emitting elements 50 may be a light emitting structure including n-type semiconductors, active layers, p-type semiconductors, first contact electrodes, and second contact electrodes, and may have the form of a flip chip in which the first and second contact electrodes are arranged toward the same direction. The first and second contact electrodes may be electrically coupled to first and second pad electrodes formed on the top surface of the substrate 40, respectively.

An anisotropic conductive film (ACF, not shown) may be coated on the substrate 40 to mediate electrical bonding of the contact electrodes and the pad electrodes. The ACF may have an anisotropic conductive adhesive adhered onto a protective film, and have a structure in which conductive balls are distributed in an adhesive resin. The conductive ball is a conductive spherical body covered with a thin insulating film, and may be able to electrically bond both conductors together when the insulating film is broken by pressure.

Accordingly, when the ACF is pressurized while the plurality of light emitting elements 50 are mounted on the substrate 40, the insulating film of the conductive ball is broken, allowing electrical bonding of the contact electrode of the light emitting element 50 and the pad electrode of the substrate 40.

Alternatively, the plurality of light emitting elements 50 may be mounted on the substrate 40 through solder bumps instead of the ACF. In this case, the solder bumps may be equipped on the mounting surface for the light emitting elements 50. After the light emitting elements 50 are arranged on the substrate 40, they may be bonded onto the substrate 40 by a reflow process. Furthermore, the light emitting element 50 may be bonded onto the substrate 40 through a bonding material formed with a resin such as epoxy, silicon, urethane, etc.

The plurality of light emitting elements 50 may include red light emitting elements 51, green light emitting elements 52, and blue light emitting elements 53, and may be mounted on the substrate 40 with a set of a red light emitting element 51, a green light emitting element 52, and a blue light emitting element 53 in a unit. The set of a red light emitting element 51, a green light emitting element 52, and a blue light emitting element 53 may form a pixel. The red light emitting element 51, the green light emitting element 52, and the blue light emitting element 53 may each form a sub pixel.

The red light emitting element 51, the green light emitting element 52, and the blue light emitting element 53 may be arranged in a row with a certain gap or in any other form such as a triangular form.

The display device may include a camera, a microphone, etc., to provide a multimedia function. The microphone has thus far been installed in a bezel on an outer edge of the display panel or a separate microphone module has been attached to the outer edge of the display device. Recent display devices, however, come out without bezels or with narrow bezels, and hence it is not easy to install the microphone in the bezel. Apart from this, as the display device grows larger, when the microphone is installed on the outer edge of the display panel, sound collecting performance of the microphone degrades because of a difference between the height or location of the microphone and height or a location at which the user utters.

Figure 3:
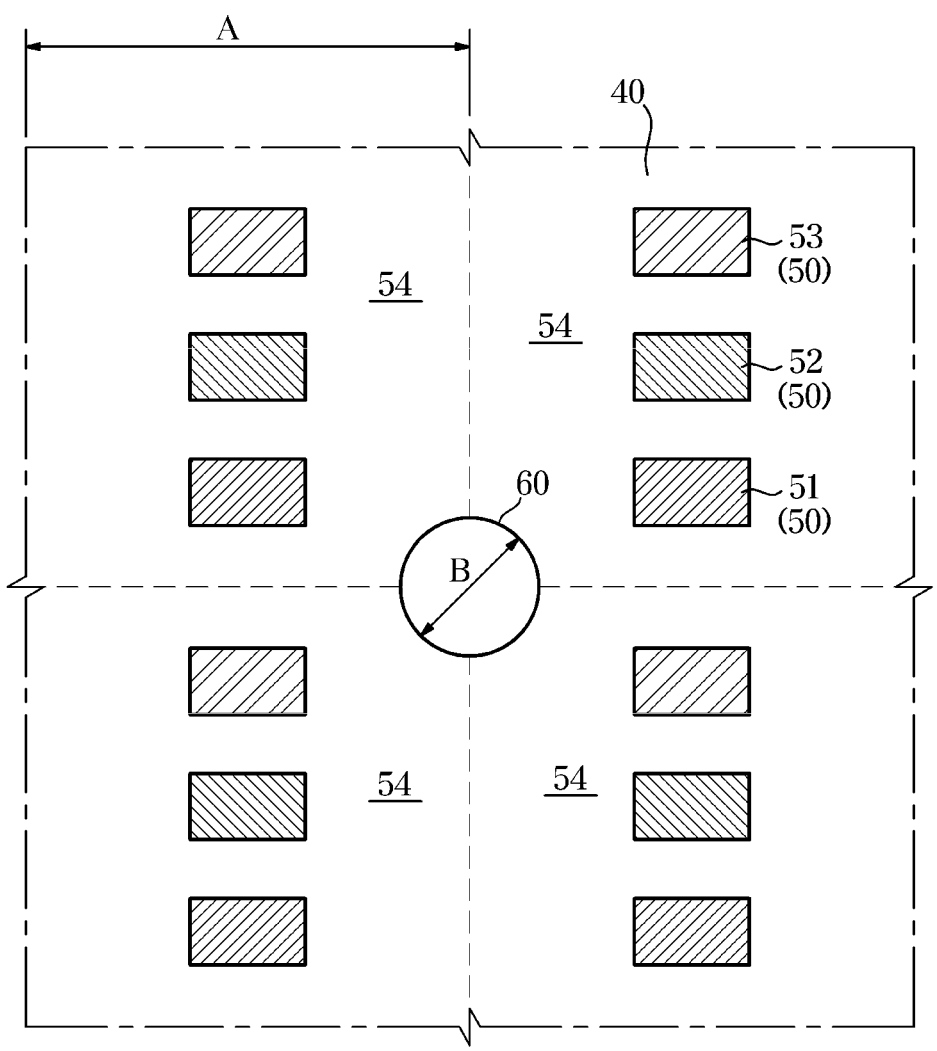
FIG. 3 is an enlarged view of pixels and a hole of the display panel of the display device of FIG. 1.
Figure 4:
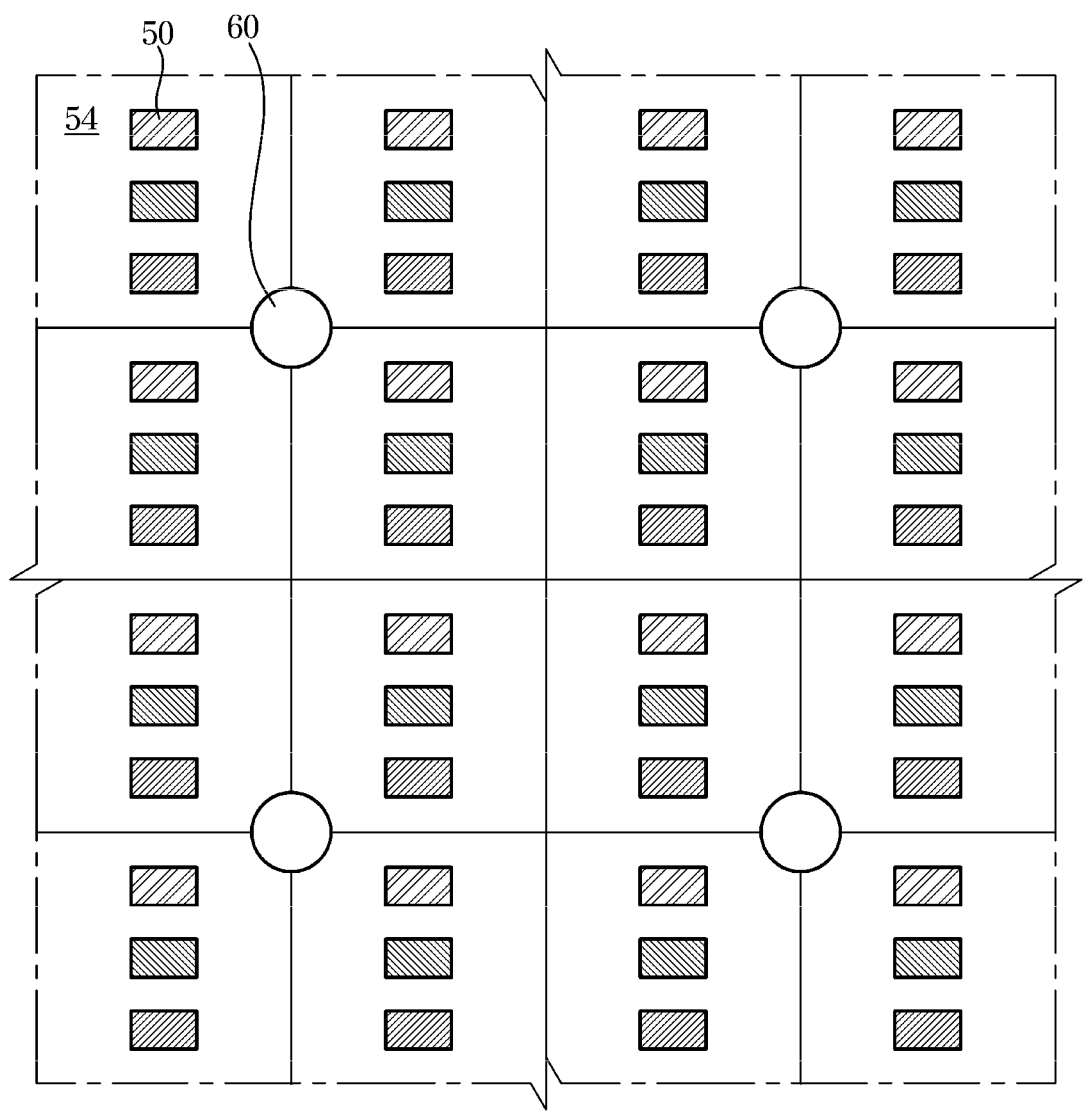
FIG. 4 is an example of a plurality of holes formed on the display panel of the display device of FIG. 1.
Figure 5:
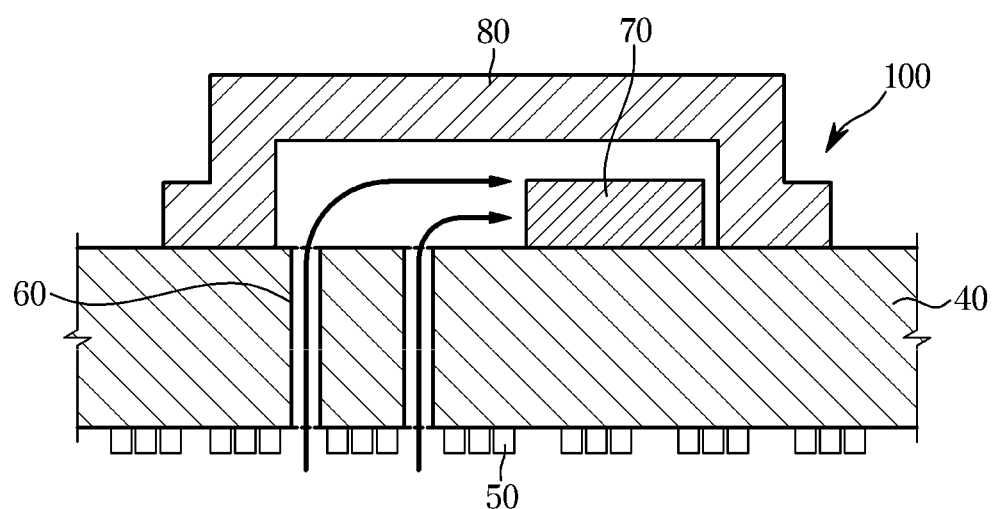
FIG. 5 is an enlarged view of a partial cross-section of the display device of FIG. 1.

FIG. 3 is an enlarged view of pixels and a hole of the display panel of the display device of FIG. 1, FIG. 4 is an example of a plurality of holes formed on the display panel of the display device of FIG. 1, and FIG. 5 is an enlarged view of a partial cross-section of the display device of FIG. 1.

In an embodiment of the disclosure, the display device 1 or the display panel 20 may include a microphone 70. The display panel 20 may include at least one hole 60 formed to penetrate the substrate 40.

The microphone 70 may be installed on a rear side 41 of the substrate 40 of the display panel 20. The microphone 70 may include a microphone using a micro electro mechanical system (MEMS) that may be mounted on a substrate. The microphone 70 is installed on the rear side 41 of the substrate 40 of the display panel 20, so there are no limitations on where to install the microphone 70. The microphone 70 may be installed at a height or location at which to collect utterance of the user effectively. The microphone 70 may be installed near the at least one hole 60, so that a sound that passes through the hole 60 may be collected.

The hole 60 may be formed between the light emitting elements 50 mounted on the substrate 40. The hole 60 may be formed between pixels 54 each having a set of the red light emitting element 51, the green light emitting element 52, and the blue light emitting element 53. The hole 60 may be formed in the space across which no circuit wiring on the substrate 40 passes. The hole 60 may be formed by mechanical drilling, laser machining, or the like after the substrate 40 is manufactured, or formed by machining during a manufacturing process of the substrate 40.

Length A of a side of each pixel 54 may be set to about 1 mm or less. In this case, the hole 60 may be formed to have diameter B of about 1 mm or less between the pixels 54. Depending on the sound collecting performance of the microphone 70, the diameter B of the hole 60 and the number of the holes 60 may be determined. The plurality of holes 60 may be formed with each pixel 54 in between, or as shown in FIG. 4, the holes 60 may be formed with two pixels in between. Although not shown, on an occasion when the display panel 20 includes the plurality of display modules 30, the display modules 30 may be machined so that the holes 60 may be formed between the display modules 30.

The display device 1 or the display panel 20 may include a plurality of the microphones 70. The plurality of microphones 70 may be arranged near the single hole or a group of holes 60. Furthermore, the plurality of microphones 70 may be installed at different locations with sufficient distance from each other in order to effectively collect the utterance of users at various locations.

The display device 1 or the display panel 20 may include a guide member 80 mounted on the rear side of the substrate 40. The guide member 80 may guide a sound that passes through at least one of the holes 60 formed on the substrate 40 to be collected by the at least one microphone 70. The guide member 80 may be arranged on the rear side of the substrate 40 to cover the at least one hole 60 and the at least one microphone 70. The guide member 80 may include a rubber material to prevent a sound that passes through the at least one hole 60 from leaking out of the guide member 80. The guide member 80 may be mounted on the rear side of the substrate 40 in various sealing methods.

The display device 1 or the display panel 20 may include a plurality of the microphones 70, a plurality of the holes 60, and a plurality of the guide members 80 to cover at least one of the holes 60 and at least one of the microphones 70.

The display device 1 or the display panel 20 may include a plurality of microphone modules 100. The microphone modules 100 may include one or a group of holes 60 and the microphone 70 located near the hole(s) 60. The microphone module 100 may include a plurality of the microphones 70. The plurality of microphone modules 100 may be installed at different locations with a sufficient distance from each other in order to effectively collect the utterance of users located at various locations. The plurality of microphone modules 100 may be variously arranged in the vertical direction or horizontal direction of the display panel 20.

Figure 6:
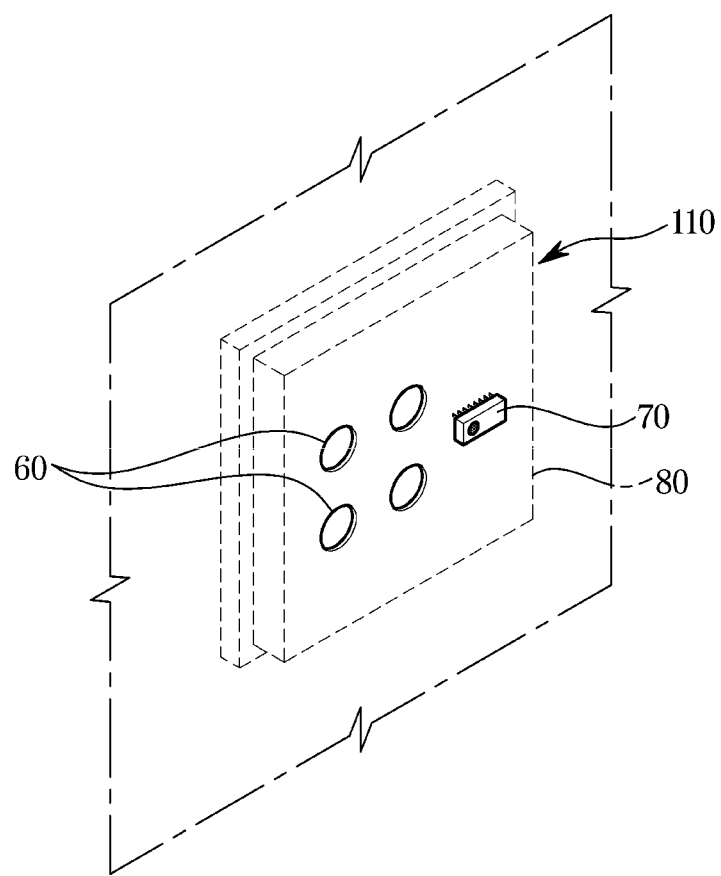
FIG. 6 is an enlarged view of a microphone module of a display device, according to an embodiment of the disclosure.

FIG. 6 is an enlarged view of a microphone module of a display device, according to an embodiment of the disclosure.

Referring to FIG. 6, a microphone module 110 may include a plurality of the holes 60 and the single microphone 70 located adjacent to the holes 60. When the microphone module 110 includes the plurality of holes 60, the holes 60 may be formed to have sufficiently small size.

Figure 7:
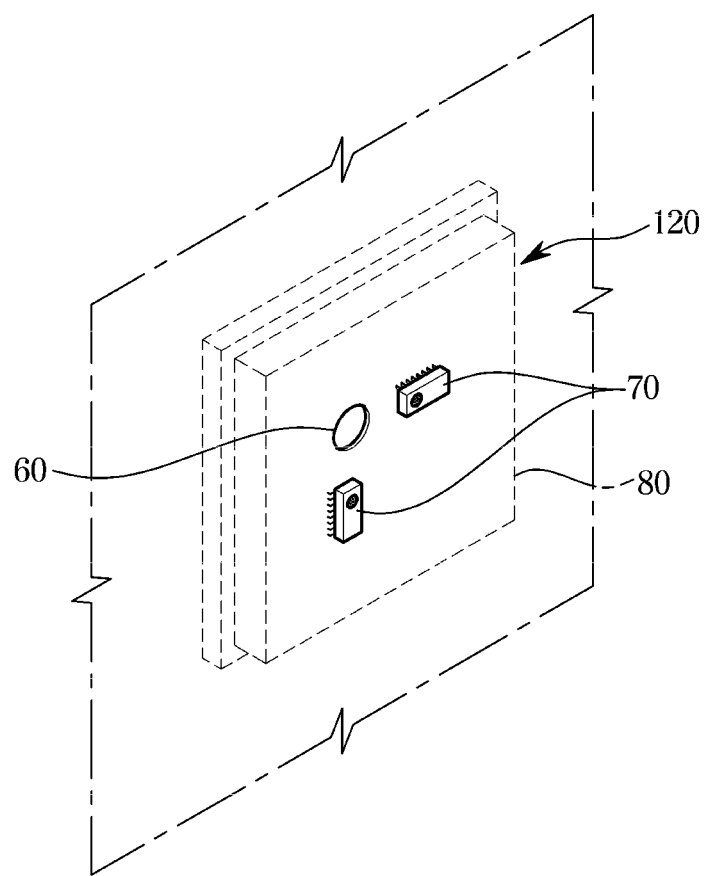
FIG. 7 is an enlarged view of a microphone module of a display device, according to another embodiment of the disclosure.

FIG. 7 is an enlarged view of a microphone module of a display device, according to another embodiment of the disclosure.

Referring to FIG. 7, a microphone module 120 may include the single hole 60 and a plurality of the microphones 70 located adjacent to the hole 60. When the microphone module 120 includes the plurality of microphones 70, the microphone module 120 may detect directivity of a sound.

Figure 8:
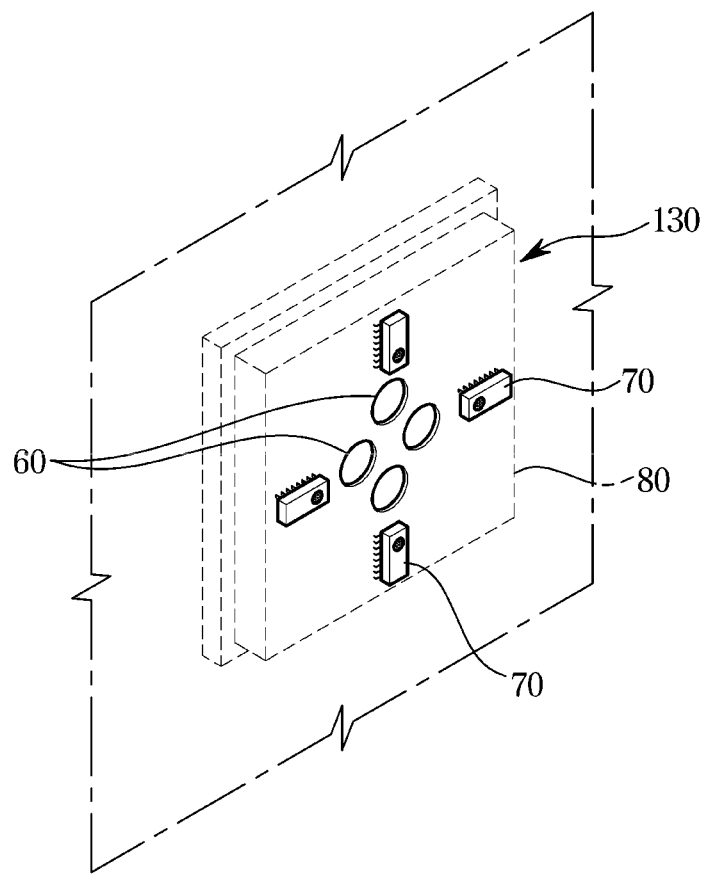
FIG. 8 is an enlarged view of a microphone module of a display device, according to another embodiment of the disclosure.

FIG. 8 is an enlarged view of a microphone module of a display device, according to another embodiment of the disclosure.

Referring to FIG. 8, a microphone module 130 may include a plurality of the holes 60 and a plurality of the microphones 70. The plurality of holes 60 of the microphone module 130 may be formed to have a size small enough to be hardly seen with the naked eye. The plurality of microphones 70 of the microphone module 130 may clearly detect a location or moving direction of an utterer.

Figure 9:
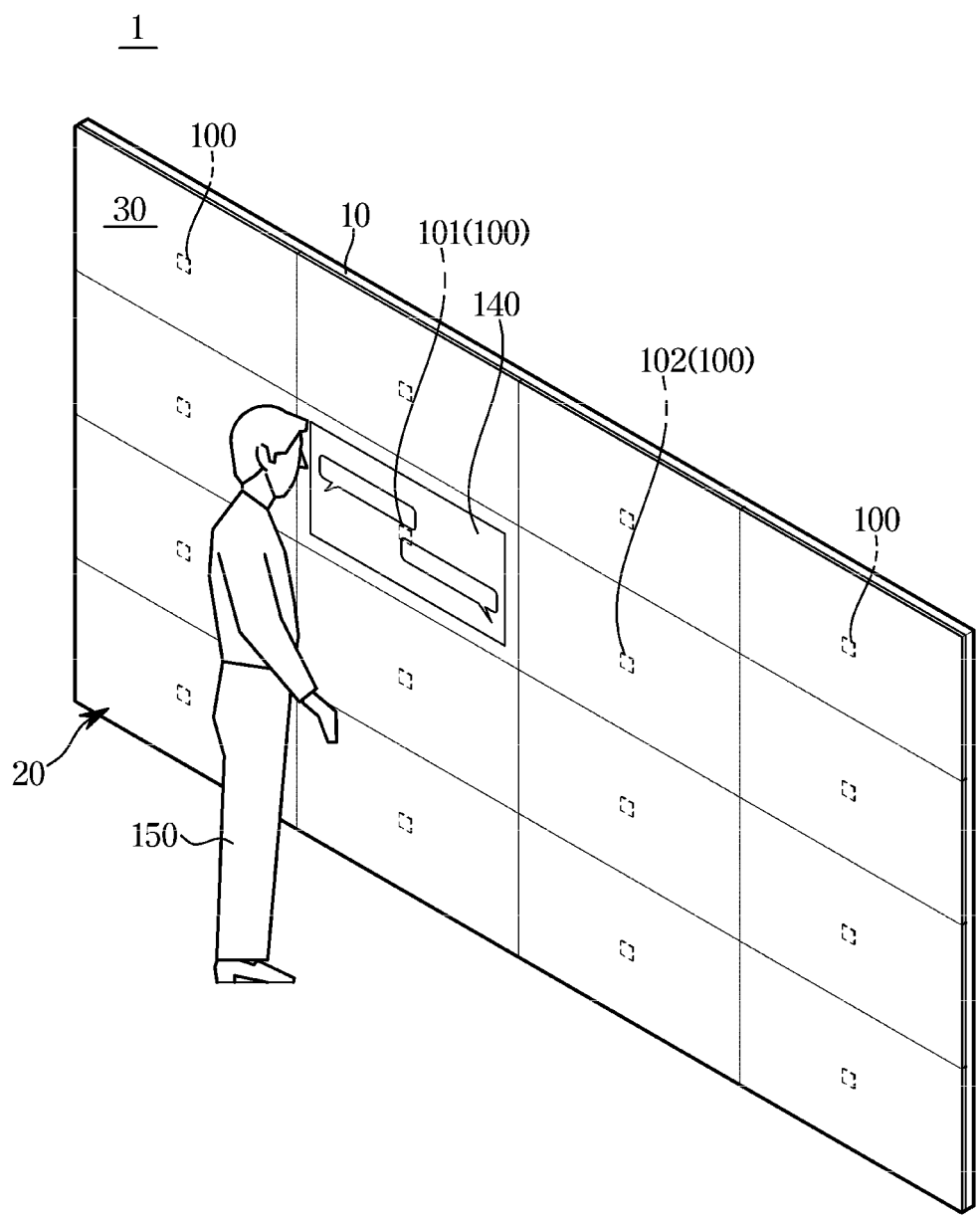
FIG. 9 shows operation of a display device, according to an embodiment of the disclosure.
Figure 10:
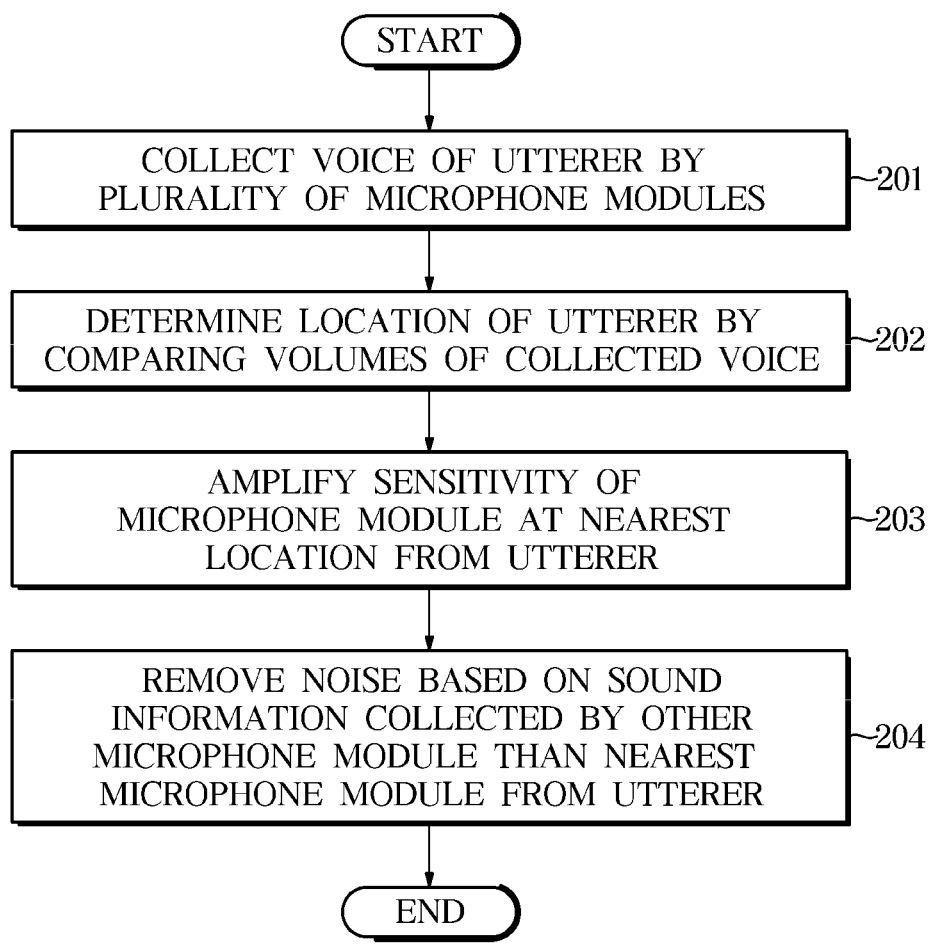
FIG. 10 is a flowchart of controlling a microphone module of a display device, according to an embodiment of the disclosure.
Figure 11:
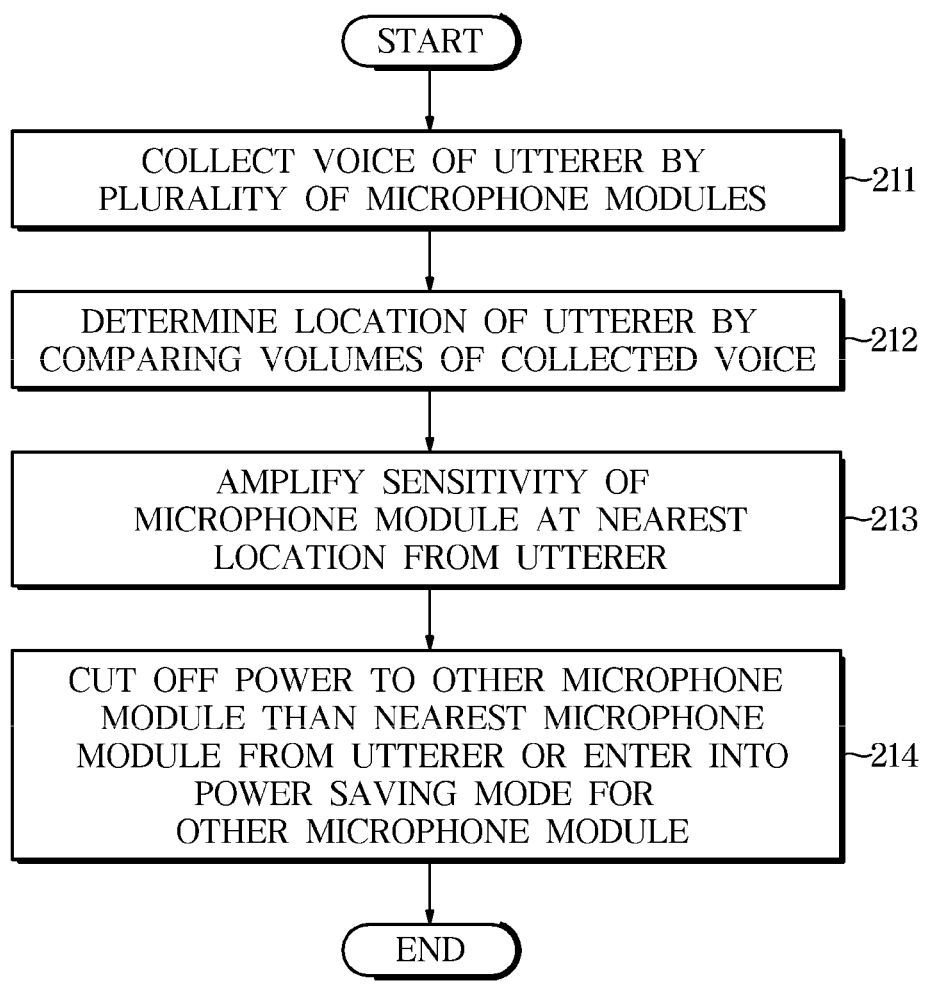
FIG. 11 is a flowchart of controlling a microphone module of a display device, according to another embodiment of the disclosure.
Figure 12:
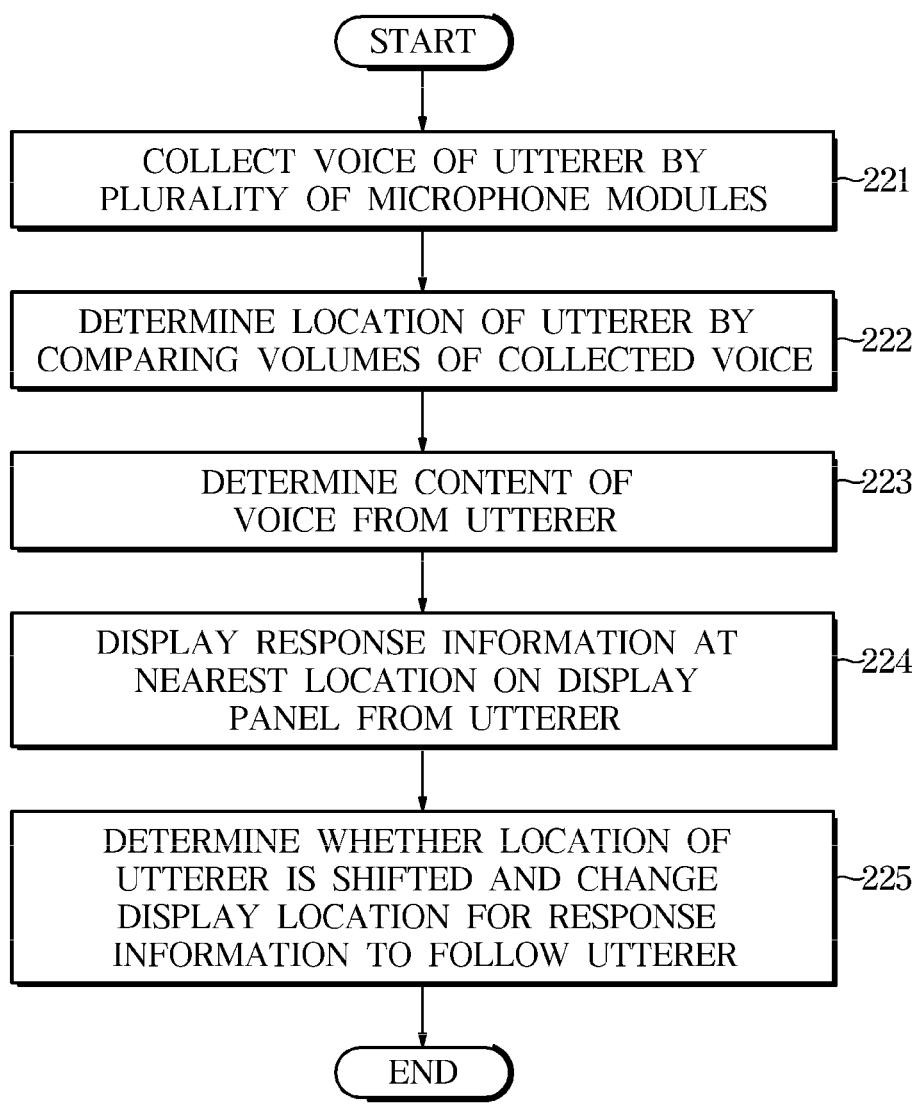
FIG. 12 is a flowchart of controlling a microphone module of a display device, according to another embodiment of the disclosure.

FIG. 9 shows operation of a display device, according to an embodiment of the disclosure. FIG. 10 is a flowchart of controlling a microphone module of a display device, according to an embodiment of the disclosure, FIG. 11 is a flowchart of controlling a microphone module of a display device, according to another embodiment of the disclosure, and FIG. 12 is a flowchart of controlling a microphone module of a display device, according to another embodiment of the disclosure.

Referring to FIGS. 2 and 9, the display device 1 or the display panel 20 may include a plurality of the microphones 70 or a plurality of the microphone modules 100. The plurality of microphones 70 or the plurality of microphone modules 100 may be arranged in a uniform distribution on the display panel 20.

The display device 1 or the display panel 20 including the plurality of microphone modules 100 or the plurality of microphones 70 may include a first processor 90 configured to cancel out noise based on voices collected by the plurality of microphone modules 100 and the plurality of microphones 70. The first processor 90 may cancel out noise in the collected sound by using a beamforming scheme, an acoustic echo cancellation (AEC) scheme, or the like.

The beamforming scheme is setting up a guard area using the plurality of microphones to identify and remove a noise source outside the guard area, except a voice of the utterer within the guard area. The AEC scheme is to separate out a voice of the utterer by removing a sound related to a content currently output from a speaker of the display device or a speaker around the display device when the sound is collected along with the voice of the utterer.

The display device 1 or the display panel 20 including the plurality of microphone modules 100 and the plurality of microphones 70 may include a second processor 91 configured to determine a location of the utterer by comparing voices collected by the plurality of microphone modules 100 and the plurality of microphones 70. The display device 1 may determine the location of the utterer with the second processor 91 and perform voice collection using the microphone 70 at an optimal location.

The display device 1 or the display panel 20 including the plurality of microphone modules 100 and the plurality of microphones 70 may include a third processor 92 configured to determine a location of the utterer and display response information at the nearest location from the utterer on the display panel 20. While first, second and third processors are discussed herein, the present invention is not limited to any number of processors and any number of processor(s) may be used to process input pertaining to sound, voice, etc.

Referring to FIGS. 9 and 10, the display device 1 or the display panel 20 including the first processor 90 collects a voice of an utterer 150 by the plurality of the microphone modules 100 or a plurality of the microphones 70, in 201. The first processor 90 determines a location of the utterer by comparing volumes of the voice collected by the microphone modules 100 or microphones 70, in 202. The first processor 90 amplifies sensitivity of the microphone module 100 or the microphone 70 at the nearest location from the utterer among the plurality of microphone modules 100 or the plurality of microphones 70, in 203. The first processor 90 removes noise except the voice of the utterer based on sound information collected by other microphone modules 100 or microphones 70 than the microphone module 100 or the microphone 70 at the nearest location from the utterer, in 204.

Referring to FIGS. 9 and 11, the display device 2 or the display panel 20 including the second processor 91 collects a voice of a utterer 150 by the plurality of the microphone modules 100 or a plurality of the microphones 70, in 211. The second processor 91 determines a location of the utterer by comparing volumes of the voice collected by the respective microphone modules 100 or microphones 70, in 212. The second processor 91 amplifies sensitivity of the microphone module 100 or the microphone 70 at the nearest location from the utterer among the plurality of microphone modules 100 or the plurality of microphones 70, in 213. The second processor 91 cuts off power supplied to other microphone modules 100 or microphones 70 than the microphone module 100 or the microphone 70 at the nearest location from the utterer, or enters into a power saving mode for the other microphone modules 100 or microphones 70, in 214. When detecting a change in volume of the collected sound, the microphone module 100 or the microphone 70 in the power saving mode or a standby mode may be normally activated again.

Referring to FIGS. 9 and 12, the display device 1 or the display panel 20 including the third processor 92 collects a voice of the utterer 150 by the plurality of the microphone modules 100 or a plurality of the microphones 70, in 221. The third processor 92 determines a location of the utterer 150 by comparing volumes of the voice collected by the respective microphone modules 100 or microphones 70, in 222. The third processor 92 determines content of the voice of the utterer 150 in 223, and displays response information 140 corresponding to the content of the voice of the utterer 150 at the nearest location from the utterer 150 on the display panel 20, in 224.

The display panel 20 may include a plurality of the display modules 30, and each of the display modules 30 may include at least one microphone 70 or microphone module 100. The third processor 92 may be configured to display the response information 140 in one of the display modules 30 located nearest the utterer 150, or across two or more of the display modules 30 near the utterer 150.

For example, as shown in FIG. 9, when the utterer 150 gives utterance at a location near a first microphone module 101, the response information 140 may be displayed on the display module 30 in which the first microphone module 101 is installed. When it is determined that the utterer 150 is located between the first and second microphone modules 101 and 102, the response information 140 may be displayed across the display modules 30 at which the first and second microphones 101 and 102 are installed, respectively.

When the utterer 150 gives utterance while in motion, the third processor 92 determines whether the location of the utterer 150 is shifted and a location shift direction by comparing volumes of the voice of the utterer 150 collected through the plurality of microphone modules 100 or the plurality of microphones 70, and changes where to display the response information 140 on the display panel 20 to follow the utterer 150.

For example, as shown in FIG. 9, when the utterer 150 that has been at the nearest location to the first microphone module 101 moves to the second microphone module 102, the response information 140 displayed on the display panel 20 may be displayed as moving from the display module 30 where the first microphone module 101 is installed to the display module 30 where the second microphone module 102 is installed continuously or intermittently.

Although not shown, the display device 1 or the display panel 20 including the plurality of microphone modules 100 or microphones 70 may be configured to simultaneously control voices of several utterers. The display device 1 or the display panel 20 may determine locations of the several utterers, and remove noise other than the voice of each utterer based on sound information collected by other microphone modules 100 or microphones 70 than the microphone module 100 or the microphone 70 at the nearest location from the utterer, in 204.

Furthermore, the display device 1 or the display panel 20 may cut off power to other microphone modules 100 or microphones 70 than the microphone module 100 or the microphone 70 at the nearest location from each utterer or enter into power saving mode for the other microphone modules 100 or microphones 70.

Moreover, the display device 1 or the display panel 20 may determine locations of the several utterers, and display the respective response information 140 at a location nearest each utterer on the display panel 20. The display device 1 or the display panel 20 may detect location shift of each utterer and display the respective response information 140 to follow the utterer.

Figure 13:
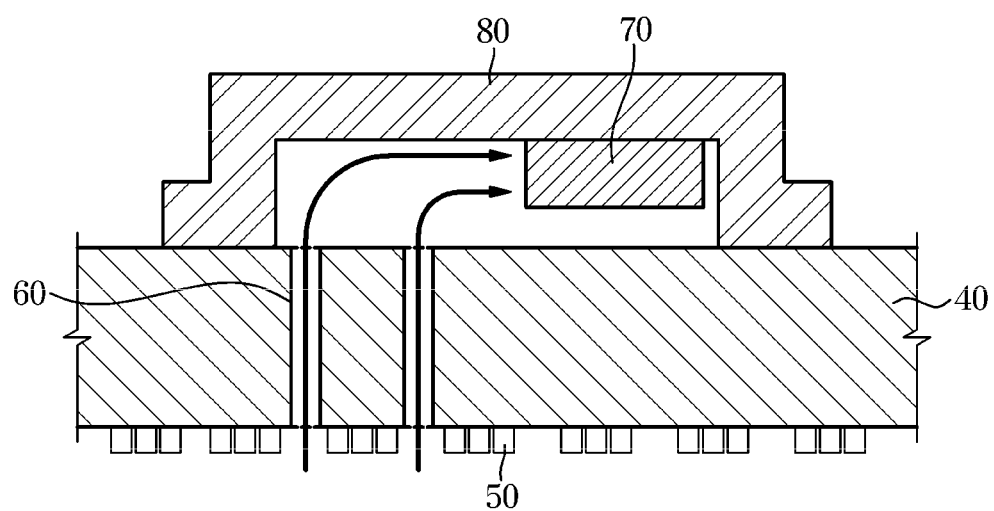
FIG. 13 is an enlarged view of a partial cross-section of a display panel of a display device, according to another embodiment of the disclosure.

FIG. 13 is an enlarged view of a partial cross-section of a display panel of a display device, according to another embodiment of the disclosure.

When a display panel 20 includes the guide member 80, the microphone 70 may be installed on the guide member 80 instead of the rear side of the substrate 40.

Figure 14:
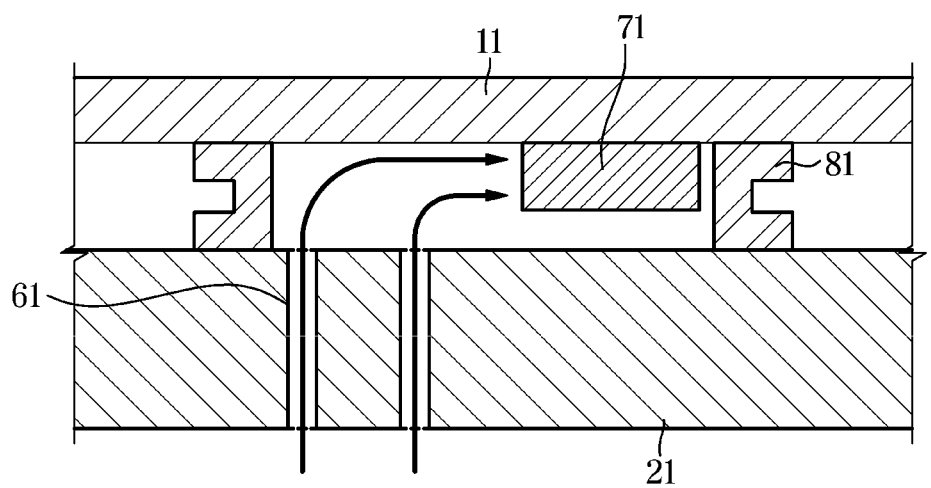
FIG. 14 is an enlarged view of a partial cross-section of a display device, according to another embodiment of the present disclosure.

FIG. 14 is an enlarged view of a partial cross-section of a display device, according to another embodiment of the present disclosure.

A display device may include not only the display panel including light emitting elements and a substrate but also a display panel 21 of a different form. The display device or the display panel 21 may include at least one hole 61 formed to penetrate an image display area, and at least one microphone 71 installed on the back of the display panel 21.

Furthermore, the display device may include a guide member 81 for guiding a sound coming into the display device through the hole 61 to be collected by the microphone 71. The microphone 71 is installed on a case 11 to support a display panel 21 from behind the display panel 21. The guide member 81 may be formed to connect the display panel 21 to the case 11 to guide the sound that passes through the hole 61 to the microphone 71. The guide member 81 may have various shapes such as a rectangular shape, a circular shape, etc., and include a rubber material to tightly contact the display panel 21 and the case 11.

According to an embodiment of the disclosure, a display panel includes a microphone installed behind an image display area at a level with the height or location where the user utters.

According to an embodiment of the disclosure, a display device includes a display panel equipped with a microphone without need for an extra space or a structure for installing the microphone in the display device, thereby making the display device slim or simple with no or narrow bezels.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A display panel comprising:
   a substrate on which a plurality of light emitting elements are mountable and on which at least one hole is formed to penetrate through the substrate among the plurality of light emitting elements;
   at least one microphone mountable on a rear side of the substrate where the at least one microphone is mounted adjacent to the at least one hole to thereby collect a sound passing through the at least one hole to the at least one microphone: and
   a guide member mounted on the rear side of the substrate and forming an accommodating space by covering a portion of the rear side of the substrate adjacent to the at least one hole, and
   wherein the at least one microphone is disposed in the accommodating space;
   wherein the guide member is configured to cross over the at least one hole and the at least one microphone; and
   wherein the at least one hole is formed between pixels, each pixel including three of the plurality of light emitting elements.

2. The display panel of claim 1, wherein the at least one microphone is among a plurality of microphones, and
   wherein the display panel further comprises a processor configured to remove noise based on a voice collected by the plurality of microphones.

3. The display panel of claim 1, wherein the at least one microphone is among a plurality of microphones, and
   wherein the display panel further comprises a processor configured to determine a location of an utterer by comparing voices collected by the plurality of microphones.

4. The display panel of claim 1, wherein the at least one microphone is among a plurality of microphones, and
wherein the display panel further comprises a processor configured to determine a location of an utterer by comparing voices collected by the plurality of microphones, and control the display panel to display response information about a content of a voice from the utterer collected by a microphone among plurality of microphones that is nearest to the location from the utterer.

5. The display panel of claim 4, wherein the processor is configured to determine whether the location of the utterer is shifted and control the display panel to display the response information by changing a location of the response information on the display panel to follow a movement of the utterer.

6. The display panel of claim 1, wherein the guide member comprises a rubber material.

7. The display panel of claim 1, wherein the guide member is among a plurality of guide members.

8. A display device comprising:
a display panel including a substrate on which at least one hole is formed which penetrates through an image display area of the display panel;
at least one microphone installed on a rear side of the display panel where the at least one microphone is installed adjacent to the at least one hole; and
a guide member arranged on the rear side of the display panel to cross over the at least one hole to guide a sound passing through the at least one hole to be collected by the at least one microphone and forming an accommodating space by covering a portion of the rear side of the substrate adjacent to the at least one hole, and
wherein the at least one microphone is disposed in the accommodating space;
wherein the guide member is configured to cross over the at least one hole and the at least one microphone; and
wherein the at least one hole is formed between pixels, each pixel including three of the plurality of light emitting elements.

9. The display device of claim 8, wherein the at least one microphone is among a plurality of microphones installed on the rear side of the display panel.

10. The display device of claim 8, wherein the at least one microphone is installed on the guide member.

11. The display device of claim 8, further comprising:
a case supporting the display panel, wherein the at least one microphone is installed on the case.

12. The display device of claim 8, wherein the guide member is among a plurality of guide members.

13. The display device of claim 8, wherein the display panel comprises a plurality of light emitting elements mountable on the substrate, and
wherein the at least one hole penetrates the substrate between the plurality of light emitting elements.

14. The display device of claim 8, wherein the at least one microphone is among a plurality of microphones, and
wherein the display panel further comprises a processor configured to remove noise based on a voice collected by the plurality of microphones.

15. The display device of claim 8, wherein the at least one microphone is among a plurality of microphones, and
wherein the display panel further comprises a processor configured to determine a location of an utterer by comparing voices collected by the plurality of microphones.

16. A display panel comprising:
a substrate having at least one hole formed between pixels; an4 at least one microphone mountable on a rear side of the substrate where the at least one microphone is mounted adjacent to the at least one hole to thereby collect a sound passing through the at least one hole to the at least one microphone: and
at least one guide member arranged over the at least one hole to guide the sound passing through the at least one hole to be collected by the at least one microphone and forming an accommodating space by covering a portion of the rear side of the substrate adjacent to the at least one hole, and
wherein the at least one microphone is disposed in the accommodating space;
wherein the guide member is configured to cross over the at least one hole and the at least one microphone; and
wherein the at least one hole is formed between pixels, each pixel including three of the plurality of light emitting elements.

* * * * *

UNITED STATES PATENT AND TRADEMARK OFFICE
CERTIFICATE OF CORRECTION

PATENT NO. : 11,112,823 B2
APPLICATION NO. : 16/742157
DATED : September 7, 2021
INVENTOR(S) : Seung Il Yoon et al.

Page 1 of 1

It is certified that error appears in the above-identified patent and that said Letters Patent is hereby corrected as shown below:

In the Specification

Column 1, Line 8:
Delete "35U." and insert -- 35 U. --, therefor.

In the Claims

Column 10, Line 45:
In Claim 1, delete "microphone:" and insert -- microphone; --, therefor.

Column 12, Line 25:
In Claim 16, delete "an4" and insert -- and --, therefor.

Column 12, Line 29:
In Claim 16, delete "microphone:" and insert -- microphone; --, therefor.

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*